United States Patent
Yamauchi et al.

(10) Patent No.: US 6,373,321 B1
(45) Date of Patent: *Apr. 16, 2002

(54) CMOS SEMICONDUCTOR DEVICE

(75) Inventors: Tadaaki Yamauchi; Kazutami Arimoto, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/140,315

(22) Filed: Aug. 26, 1998

Related U.S. Application Data

(62) Division of application No. 08/663,955, filed on Jun. 14, 1996, now Pat. No. 5,838,047.

(30) Foreign Application Priority Data

Jun. 16, 1995 (JP) .............................................. 7-150362

(51) Int. Cl.[7] ............................. G05F 3/16; H03K 17/16
(52) U.S. Cl. ....................... 327/534; 327/538; 327/537; 326/33; 326/34
(58) Field of Search ................................ 327/534, 530, 327/535, 536, 437, 537, 538; 326/33, 34

(56) References Cited

U.S. PATENT DOCUMENTS

| 5,461,338 A | * 10/1995 | Hirayama et al. | 327/534 |
| 5,557,231 A | 9/1996 | Yamaguchi et al. | 327/534 |
| 5,610,533 A | * 3/1997 | Arimoto et al. | 326/34 |
| 5,838,047 A | * 11/1998 | Yamauchi et al. | 327/537 |

FOREIGN PATENT DOCUMENTS

JP     5-108194      4/1993

OTHER PUBLICATIONS

Daisaburo Takashima et al., "Stand–by/Active Mode Logic for Sub–1 V1G/4Gb DRAMs" VLSI Circuit Symp. 1993, pp. 83–84.

\* cited by examiner

Primary Examiner—Dinh T. Le
(74) Attorney, Agent, or Firm—McDermott, Will & Emery

(57) ABSTRACT

A semiconductor device includes a PMOS transistor and an NMOS transistor. In a standby state, a potential of Vcc level is applied to the substrate of the PMOS transistor and a potential of Vss level is applied to the substrate of the NMOS transistor. Therefore, the voltage between the source and substrate of the P and NMOS transistors becomes 0 V. In an active state, potentials that render the voltage between the source and substrate lower than the built-in potential are applied to respective substrates of the P and NMOS transistors. Therefore, the threshold voltage of the transistor is lowered in an active state than in a standby state, and almost no leakage current flows between the source and substrate.

4 Claims, 13 Drawing Sheets

CMOS SEMICONDUCTOR DEVICE

CROSS-REFERENCE TO RELATED APPLICATIONS

This application is a divisional of application Ser. No. 08/663,955 filed Jun. 14, 1996 and now patented, U.S. Pat. No. 5,838,047.

This application is related to copending application Ser. No. 08/038,987, filed Mar. 29, 1993 an now abandoned, commonly assigned with the present application.

BACKGROUND OF THE INVENTION

1. Field of the Invention

The present invention relates to semiconductor devices, and more particularly to a semiconductor device realizing high speed operation with a low voltage.

2. Description of the Background Art

During these few past years, reduction in the level of a power supply voltage is required to reduce element breakdown voltage due to reduction in consumption power and miniaturization of elements. However, the operating speed of an MOS transistor is reduced since the threshold voltage cannot be neglected at a low voltage. The threshold voltage is reduced in an active state to prevent this delay. Reduction in the threshold voltage poses the problem of increase in leakage current due to subthreshold current of an MOS transistor in a standby state. In view of this problem, Japanese Patent Laying-Open No. 5-108194 discloses a low consumption power type integrated semiconductor device directed to provide an information processor that can operate at high speed even with a low power supply voltage in an active state and that has consumption power due to leakage current reduced in a standby state.

FIG. 15 shows an embodiment of this low consumption power type integrated semiconductor device described in Japanese Patent Laying-Open No. 5-108194.

Referring to FIG. 15, the threshold value of an MOS transistor (MN, MP) is set to a low value in order to maintain high speed operation at a low power supply voltage. The device enters a standby mode by a program command or an external control signal upon determination of no keyboard input for more than a predetermined time period or continuation of a low consumption power state for more than a predetermined time period.

In a standby mode, a clock control circuit 3 suppresses application of a clock Ckm to an MPU (Microprocessor Unit) 1. At the same time, the provision of an operation mode switching signal A activates basic bias circuits 2-1 and 2-2, whereby a negative substrate bias $V_{Bn}$ and a substrate bias $V_{Bp}$ more positive than the power supply voltage are applied to an NMOS transistor (MN) and a P channel MOS transistor (MP), respectively. The application of a substrate bias causes the threshold value of the MOS transistor to be increased, whereby the leakage current is lowered in an exponential function by the increased threshold value. That is to say, application of a substrate bias improves the subthreshold characteristic to reduce leakage current. Reduction in leakage current is greater in proportion to a greater number of elements in the microprocessor. The value becomes greater than the consumption power of substrate bias circuits 2-1 and 2-2. Thus, an information processor that can operate at high speed with low voltage and that has low consumption power during a standby mode is available.

However, the conventional low consumption power type integrated semiconductor device shown in FIG. 15 has problems set forth in the following. Since a positive substrate bias $V_{Bp}$ and a negative substrate bias $V_{Bn}$ are applied to a PMOS transistor (MP) and an NMOS transistor (MN), respectively, in a standby state, reverse bias is established between the source and substrate to increase the depletion layer. Although the threshold voltage is boosted in a standby state, a short channel effect becomes noticeable as the scale of integration is increased for the low consumption power type integrated semiconductor device. This poses the problem that leakage current based on the subthreshold current of the MOS transistor in a standby state, and in turn consumption power, will not be reduced sufficiently.

SUMMARY OF THE INVENTION

An object of the present invention is to provide a semiconductor device that has high threshold voltage and that can have consumption power due to leakage current by short channel effect reduced in a standby state, and that has the threshold voltage reduced and that can operate at high speed with low power supply voltage in an active state.

According to an aspect of the present invention, a semiconductor device includes a P channel MOS transistor having a standby state and an active state, an N channel MOS transistor having a standby state and an active state, a first potential supply circuit providing a 0 or positive potential to a substrate of the P channel MOS transistor on the basis of a potential of a source electrode thereof when the P channel MOS transistor attains a standby state, a second potential supply circuit for supplying a negative potential having an absolute value lower than a built-in potential to the substrate of P channel MOS transistor on the basis of a potential of the source electrode of the P channel MOS transistor, a third potential supply circuit for supplying a 0 or negative potential to a substrate of the N channel MOS transistor on the basis of a potential of a source electrode thereof when the N channel MOS transistor attains a standby state, and a fourth potential supply circuit for supplying a positive potential having an absolute value lower than a built-in potential to the substrate of the N channel MOS transistor on the basis of a potential of the source electrode of the N channel MOS transistor.

According to the above-described semiconductor device, the P channel MOS transistor and the N channel MOS transistor have the threshold voltage increased when in a standby state, whereby leakage current based upon the subthreshold current is reduced. Furthermore, increase of the depletion layer is reduced since forward bias is established between the source and substrate. Therefore, leakage current will not increase even when short channel effect is significant due to the scale of integration increased in the semiconductor device. Only a small current flows between the source and substrate in active state since a bias of an absolute value lower than the built-in potential is applied therebetween. The threshold voltage is lowered than in a standby state with almost no influence in the operation.

According to another aspect of the present invention, a semiconductor device includes a P channel MOS transistor turned on/off in response to an input signal, an N channel MOS transistor turned on/off in response to an input signal, a first potential supply circuit for supplying a 0 or positive potential to a substrate of a P channel MOS transistor on the basis of a potential of a source electrode thereof when the P channel MOS transistor is turned off, a second potential supply circuit for supplying a negative potential to the substrate of the P channel MOS transistor on the basis of a potential of a source electrode thereof when the P channel MOS transistor is turned on, a third potential supply circuit for supplying a 0 or negative potential to a substrate of the N channel MOS transistor on the basis of a potential of a source electrode thereof when the N channel MOS transistor is turned on, and a fourth potential supply circuit for supplying a positive potential to the substrate of the N channel MOS transistor on the basis of the potential of the source electrode of the N channel MOS transistor thereof when the N channel MOS transistor is turned on.

According to the semiconductor device of the another aspect, the P channel MOS transistor and the N channel MOS transistor have the threshold voltages increased when turned off to reduce leakage current based on the subthreshold current. Furthermore, increase of the depletion layer is reduced since forward bias is established between the source and substrate. Therefore, leakage current will not increase even when short channel effect is significant caused by the scale of integration increased for the semiconductor device. The threshold voltage is lower in an ON state than in an OFF state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

(1) First Embodiment

Figure 1A:
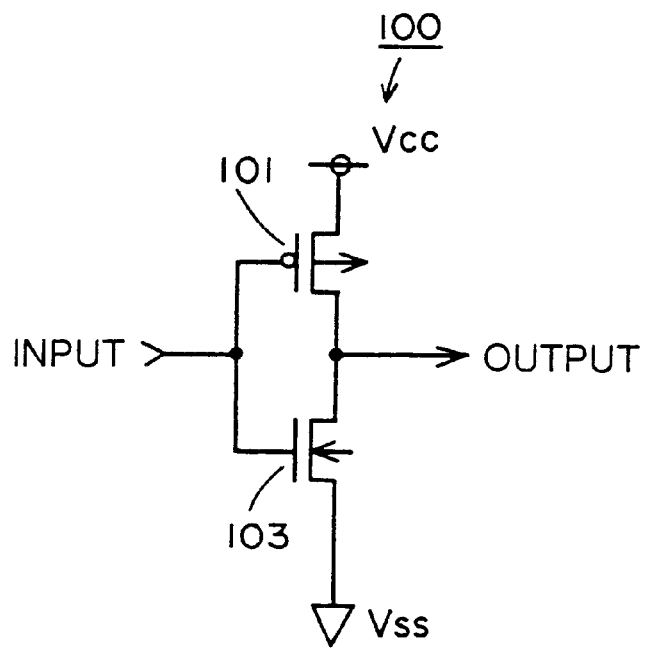
FIGS. 1A and 1B are circuit diagrams showing an CMOS circuit according to a first embodiment of a semiconductor device of the present invention.
Figure 1B:
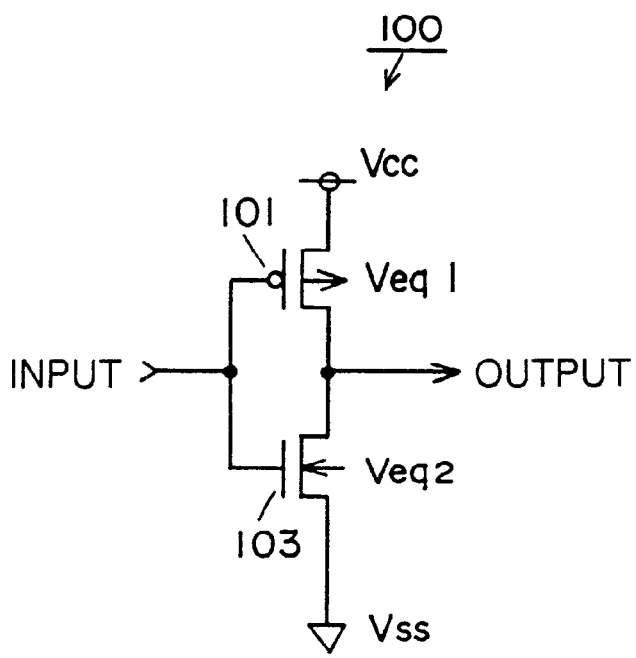

FIGS. 1A and 1B show an CMOS circuit 100 formed on a P type substrate according to a first embodiment of the present invention. FIG. 1A shows a standby state, and FIG. 1B shows an active state.

Referring to FIGS. 1A and 1B, CMOS circuit 100 functioning as an inverter circuit includes a P channel MOS transistor (referred to as PMOS hereinafter) 101, and an N channel MOS transistor (referred to as NMOS hereinafter) 103.

The source of PMOS 101 is connected to a Vcc power supply. The source of NMOS 103 is connected to Vss. PMOS 101 and NMOS 103 have their gates connected by an input node to which a control signal is applied. PMOS 101 has its drain and NMOS 103 has its drain connected by an output node from which a signal generated according to an input control signal is provided.

Figure 1C:
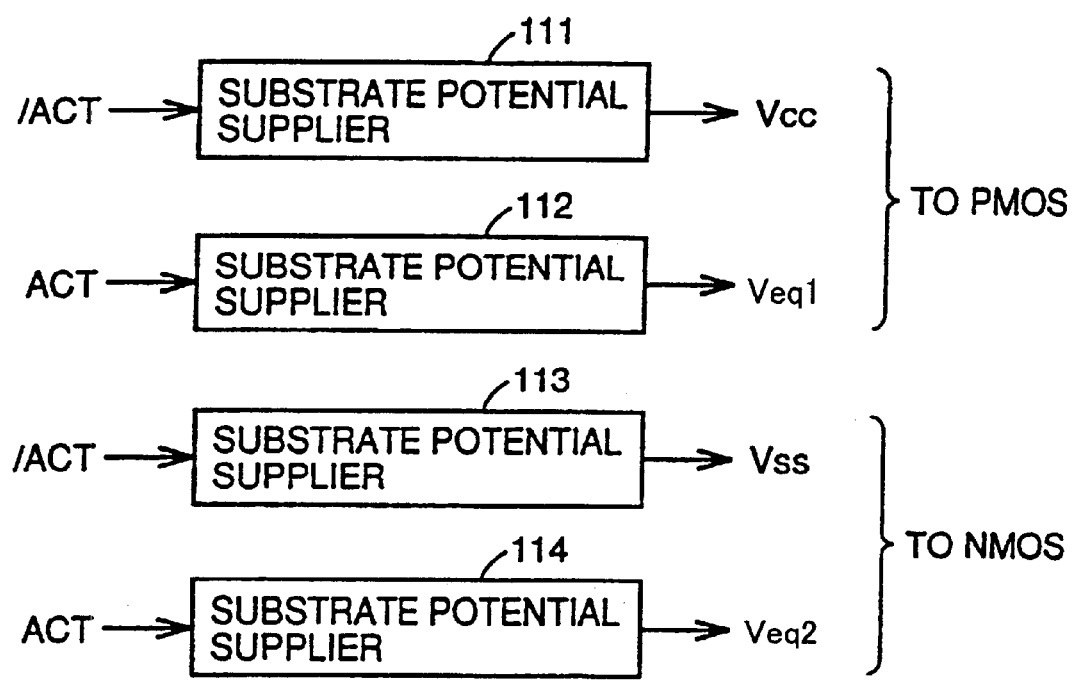
FIG. 1C is a block diagram showing a substrate potential supplier that supplies substrate potential to a transistor in the CMOS circuit shown in FIGS. 1A and 1B.

Referring to FIG. 1C, the semiconductor device of the first embodiment further includes substrate potential suppliers 111–114. Substrate potential supplier 111 responds to an active control signal/ACT to supply a potential of a Vcc level to the substrate of PMOS 101. Substrate potential supplier 112 responds to an active control signal ACT to supply a potential of an Veq1 level to the substrate of PMOS 101. Substrate potential supplier 1113 responds to active control signal/ACT to supply a signal of a Vss level to the substrate of NMOS 103. Substrate potential supplier 114 responds to active control signal ACT to supply a signal of a Veq2 level to the substrate of NMOS 103. It is assumed that PMOS 101 and NMOS 103 attain a standby state and an active state when active control signal ACT attains an L level (logical low) and an H level (logical high), respectively.

In the standby state shown in FIG. 1A, a potential of Vcc level is supplied from substrate potential supplier 111 to the substrate of PMOS 101, and a potential of Vss level is supplied from substrate potential supplier 113 to the substrate of NMOS 103. Therefore, back bias Vbs in PMOS 101 and NMOS 103 both attain the level of 0 V.

In the active state shown in FIG. 1B, a potential of Veq1 level is supplied from substrate potential supplier 112 to the substrate of PMOS 101, and a potential of Veq2 level is supplied from substrate potential supplier 114 to the substrate of NMOS 103. Back bias Vbs (PMOS) of PMOS 101 is Vbs (PMOS)=Vcc−Veq1<Φbuild (built-in potential), and back bias Vbs (NMOS) of NMOS 103 is Vbs (NMOS)= Veq2−Vss<Φbuild.

Figure 2A:
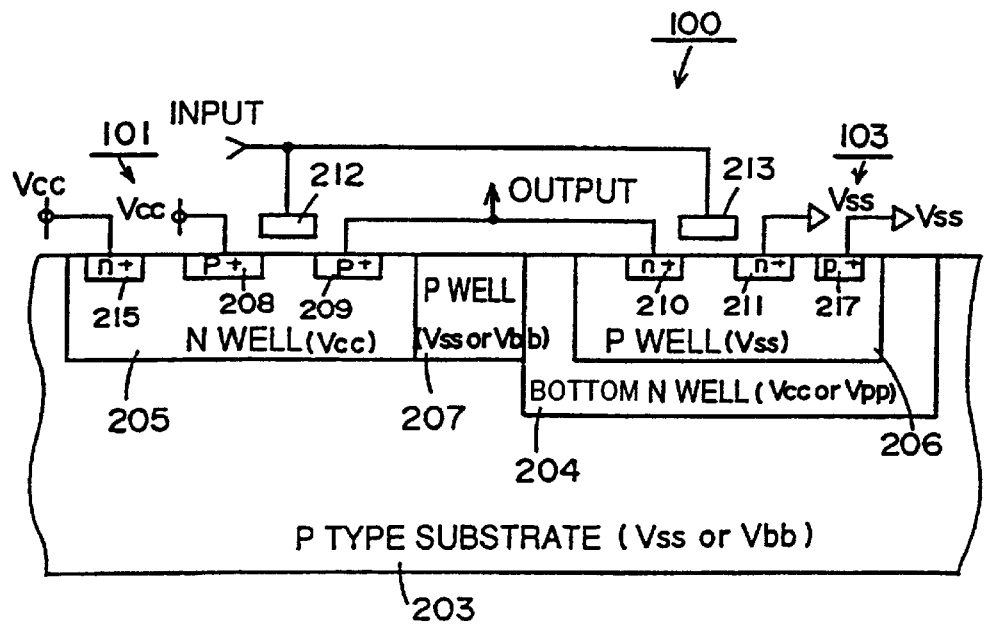
FIGS. 2A and 2B are sectional views showing a structure of the CMOS circuit of FIG. 1.
Figure 2B:
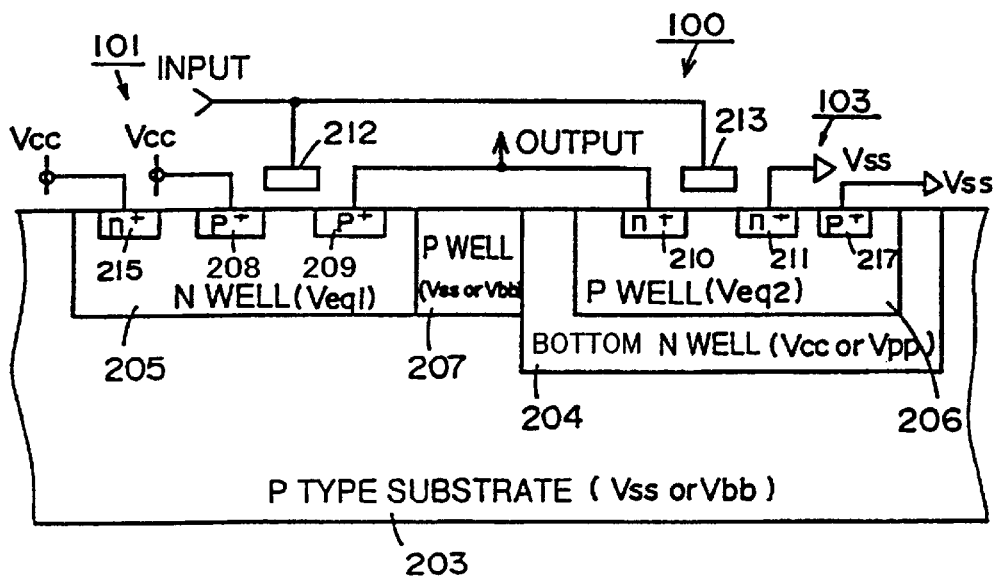

FIG. 2A and FIG. 2B show a standby state and an active state of CMOS circuit 100.

The structure of CMOS circuit 100 will be described in detail with reference to FIGS. 2A and 2B.

CMOS circuit 100 includes a P channel substrate (P-Sub) 203; a bottom N well 204 in a triple well structure; an N well 205; P wells 206 and 207; a source electrode 208, a drain electrode 209, and a gate electrode 212 of PMOS 101; a source electrode 211, a drain electrode 210, and a gate electrode 213 of NMOS 103; an n$^+$ region 215; and a p$^+$ region 217.

On P type substrate 203, N well 205, P well 207, and bottom N well 204 are juxtaposed. A P well is formed on bottom N well 204. On N well 205, source electrode 208, drain electrode 209, and n$^+$ region 215 are formed. Gate electrode 212 is provided on a region between source electrode 208 and drain electrode 209. On P well 206, drain electrode 210, source electrode 211, and p$^+$ region 217 are formed. Furthermore, gate electrode 213 is provided on a region between drain electrode 210 and source electrode. 211. Source electrode 208 and n+ region 215 are connected to Vcc power supply. Source electrode 211 and drain electrode 210 are connected to ground potential Vss. Gate electrodes 212 and 213 are connected by an input node to which a control signal is provided. Drain electrodes 209 and 210 are connected by an output node from which a signal generated on the basis of an input control signal is provided.

Here, P-Sub 203 is supplied with a potential of a Vss level or a Vbb level that is lower than Vss. Bottom N well 204 is supplied with a potential of a Vcc level or a Vpp level higher than Vcc. P well 207 separates bottom N well 204 from N well 205. Potential of Vss level or Vbb level is supplied to P well 207.

In a standby state, a potential of a Vcc level and a Vss level are supplied to N well 205 which is a substrate of PMOS 101 and to P well 206 which is the substrate of NMOS 103, respectively. In an active state, N well 205 and P well 206 are supplied with a potential of Veq1 level and Veq2 level, respectively. Here, the relationship of Veq1<Vcc, Vss<Veq1 is established.

In a standby state, substrate potential (back bias) Vbs on the basis of the potential of respective source electrodes of PMOS 101 and NMOS 103 is 0 V. In an active state, back bias Vbs of PMOS 101 and NMOS 103 is Vbs (PMOS)= Veq1−Vcc<0 V and Vbs (NMOS)=Veq2−Vss<0 V. It is known that the threshold voltage of each transistor is increased as back bias Vbs (NMOS) is reduced to a negative level in NMOS 103 and as back bias Vbs (PMOS) is increased to a positive level in PMOS 101. This is called "back bias effect". Since the threshold voltages of PMOS 101 and NMOS 103 become lower in an active state than in a standby state due to this back bias effect, leakage current based on the subthreshold current of an MOS transistor can be maintained at a low level in a standby state while increasing the current driving capability of the MOS transistor in an active state to allow high speed operation.

As shown in the active state of FIG. 2B, forward bias of (Vcc−Veq1) level and Veq2 level are applied to the p-n junction of source electrode 208 and N well 205 and the p-n junction of source electrode 211 and P well 206.

Figure 3:
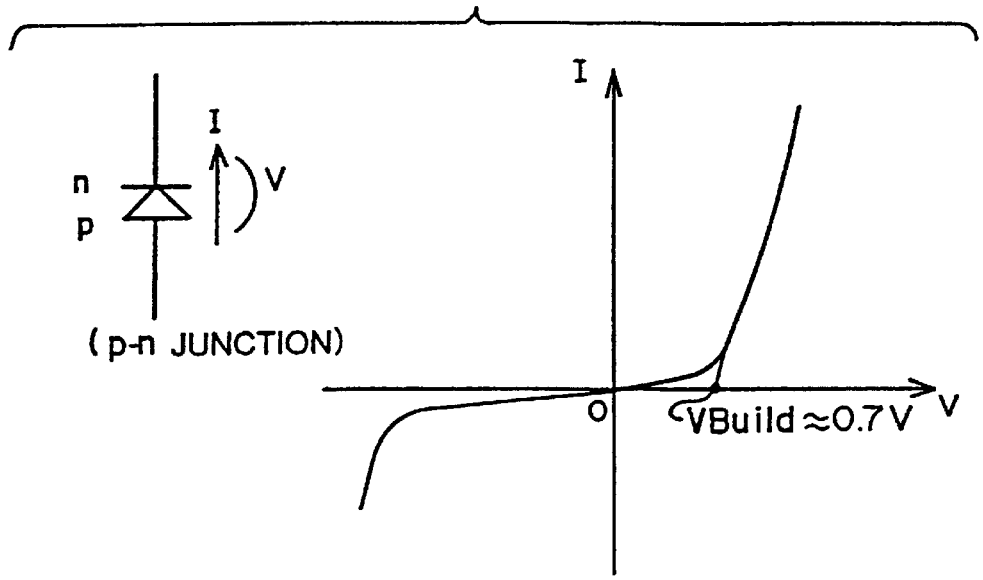
FIG. 3 is a graph showing current I—voltage V characteristics in a p-n junction.

It is appreciated from the graph of FIG. 3 that the current flowing across the p-n junction is extremely low even when a forward bias is applied thereto when below the built-in potential (Φbuild) which is a physical constant. The value of built-in potential Φbuild is typically 0.7~0.8 V. By setting the forward bias (−Vbs) applied across the p-n junction of source electrode 208 and N well 205 and the p-n junction of source electrode 211 and P well 206 to be below the built-in potential, the leakage current towards the substrate via this p-n junction is so small that it can be neglected.

Therefore, PMOS 101 and NMOS 103 are increased in the threshold voltage by back bias effect when in a standby state, so that leakage current based on subthreshold current is reduced.

Furthermore, increase of the depletion layer is reduced since forward bias is established between the source and substrate. Therefore, leakage current will not increase even when short channel effect is significant due to the scale of integration increased in the semiconductor device. Only a small current flows between the source and substrate in active state since a bias of an absolute value lower than the built-in potential is applied therebetween. The threshold voltage is lowered than in a standby state with almost no influence in the operation. Thus, high speed operation with a low power supply voltage is allowed.

(2) Second Embodiment

Although the above embodiment describes CMOS circuit 100 formed on a P type substrate, a CMOS circuit 100' can similarly be formed on an N type substrate.

Figure 4:
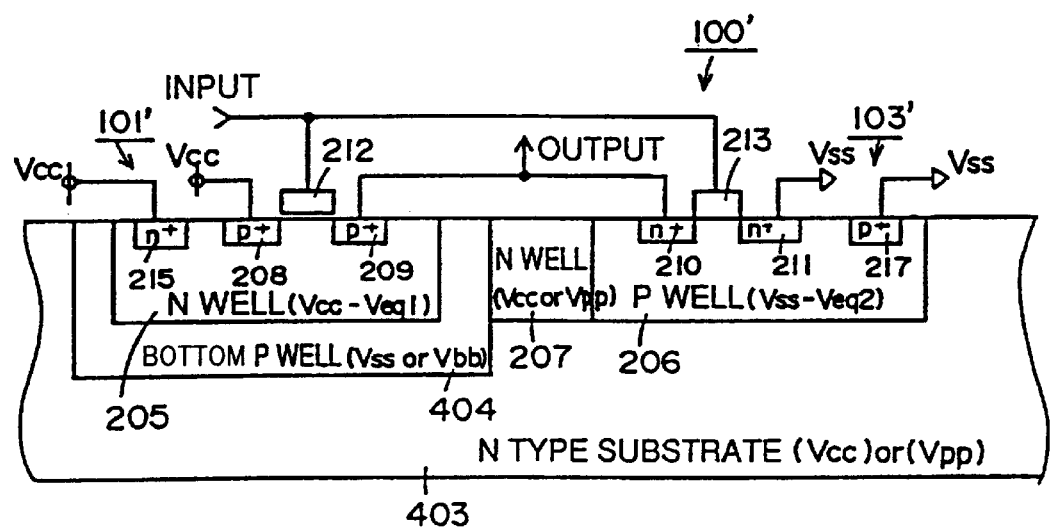
FIG. 4 is a sectional view showing a structure of a CMOS circuit according to a second embodiment of a semiconductor device of the present invention.

Referring to FIG. 4, CMOS circuit 100' includes an N type substrate 403; a bottom P well 404 in a triple well structure; a P well 406; an N wells 405 and 407; a source electrode 408, a drain electrode 409, and a gate electrode 412 of an PMOS 101'; a source electrode 411, a drain electrode 410, and a gate electrode 413 of an NMOS 103; an n+ region 415 and a p+ region 417.

On N type substrate 203, P well 404, N well 407 and P well 406 are juxtaposed. On bottom P well 404, N well 405 is formed. On N well 405, source electrode 408, drain electrode 409, and n+ region 415 are formed. Gate electrode 412 is formed on a region between source electrode 408 and drain electrode 409. On P well 406, drain electrode 410, source electrode 411, and p+ region 417 are formed. Gate electrode 413 is formed on a region between drain electrode 410 and source electrode 411.

Source electrode 408 and n+ region 415 are connected to Vcc power supply. Source electrode 411 and p+ region 417 are connected to ground potential Vss. Gate electrodes 412 and 413 are connected by an input node to which a control signal is applied. Drain electrodes 409 and 410 are connected to an output node from which a signal generated according to input control signal is provided.

Substrate N well 405 of PMOS 101' is applied with a potential of Vcc level and Veq1 level when in a standby state and an active state, respectively. Substrate P well 406 of NMOS 103' is applied with a potential of Vss level and Veq2 level when in a standby state and an active state, respectively. A potential of Vcc level or Vpp level higher than Vcc is applied to N type substrate 403 and N well 407. A potential of Vss level or Vbb level lower than Vss is applied to bottom P well 404.

(3) Third Embodiment

A PMOS circuit of a semiconductor device of the present invention can also be formed by transistors on an SOI (Silicon on Insulator) substrate besides the above-described CMOS circuit of a triple well structure.

Figure 5:
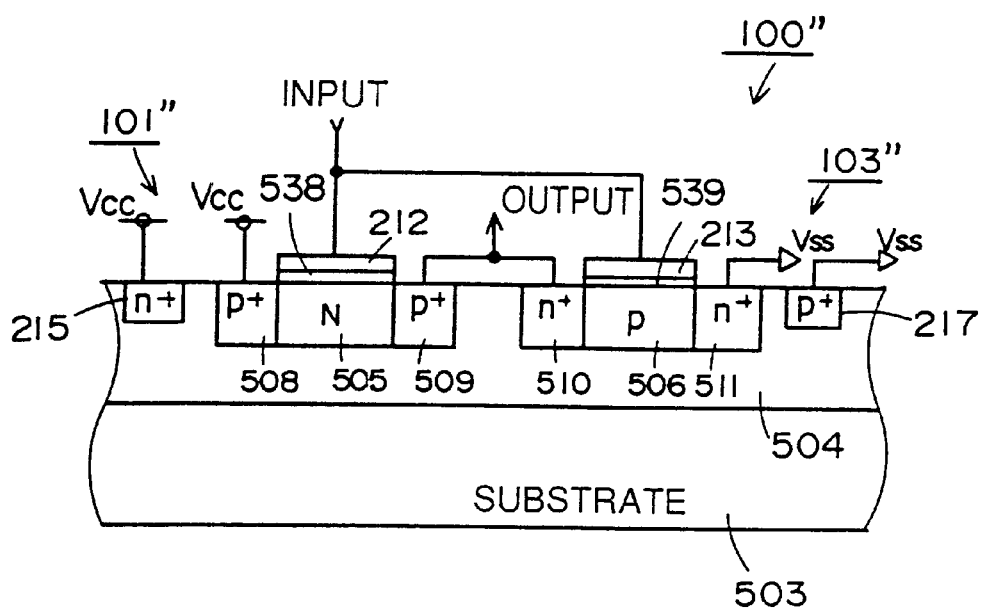
FIG. 5 is a sectional view showing a structure of a CMOS circuit according to a third embodiment of a semiconductor device of the present invention.

FIG. 5 is a sectional view of an CMOS circuit 100" formed on an SOI substrate according to a third embodiment of a semiconductor device of the present invention.

Referring to FIG. 5, CMOS circuit 100" includes a substrate 503; an $SiO_2$ 504; a source electrode 508, a drain electrode 509, an N type active region 505, and a gate 512 of PMOS 101"; a source electrode 511, a drain electrode 510, a P type active region 506, a gate electrode 513, and gate oxide films 538 and 539 of an NMOS 103"; an n+ region 115; and a p+ region 217.

$SiO_2$ 504 is formed on substrate 503. Source electrode 508 and drain electrode 509 are formed sandwiching N type active region 505, and source electrode 511 and drain electrode 510 are formed sandwiching P type active region 506 on $SiO_2$ 504 respectively. Gate oxide film 538 on N type active region 505 has gate electrode 512 formed thereon. Gate oxide film 539 on P type active region 506 has gate electrode 513 formed thereon. Source electrode 508 and n+ region 215 are connected to Vcc power supply. Source electrode 511 and p+ region 217 are connected to ground potential Vss. Gate electrodes 512 and 513 are connected by an input node to which a control signal is applied. Drain electrodes 509 and 510 are connected by an output node to which a signal generated according to an input control signal is connected.

Here, a change in the potential of N type active region 505 and P type active region 506 causes change in the threshold voltage of a transistor by the aforementioned back bias effect. As shown in FIGS. 2A, 2B, and 4, the potentials of N type active regions 505 and P type active regions 506 are set to the levels of Vcc and Vss, respectively, in a standby state, and to Veq1 and Veq2, respectively, in an active state, similar to the CMOS circuit of a triple well structure. It is to be noted that the relationship of Vss<Veq1, Veq2<Vcc is established. Here, back bias Vbs across the source and substrate in PMOS 100" and NMOS 103" in a standby state is 0 V. In an active state, back bias Vbs is Vbs (PMOS)= Veq1−Vcc, Vbs (NMOS)=Veq2−Vss, whereby the threshold voltage of the transistor is lowered due to back bias effect. Thus, leakage current can be maintained at a low level in a standby state and the MOS current driving capability increased in an active state to allow implementation of high speed operation.

In the SOI structure of FIG. 5, there is no junction with the substrate or the surrounding bottom P well as in the triple well structure shown in FIGS. 2A, 2B and 4. The only p-n junction portion of N type active region 505 and P type active region 506 are the junctions between respective sources and drains of 508, 509 and 511, 510. Therefore, the charging/discharging current when the reverse bias is varied becomes smaller in the SOI structure than that in a triple well structure. Here, SOI is a partial depleted transistor. Therefore, threshold voltage Vth can be controlled by applying back bias Vbs.

(4) Fourth Embodiment

In the first embodiment, realization of high speed operation was described by applying back bias Vbs that attains a forward bias smaller than the built-in potential the to p-n junction portion between the source of the transistor and the substrate in an active state. In the triple well structure of FIG. 2, the amount that is charged/discharged is C1 (Vcc−Veq1)+C2 (Veq2) where C1 is the parasitic capacitance of N well 205 and C2 is the parasitic capacitance of P well 206. Such increase in the region where the back bias is to be varied causes higher parasitic capacitances C1 and C2 to result in a greater charging/discharging current. In the fourth embodiment, a structure for suppressing increase of the charging/discharging current exhibited in the first embodiment will be described.

Figure 6:
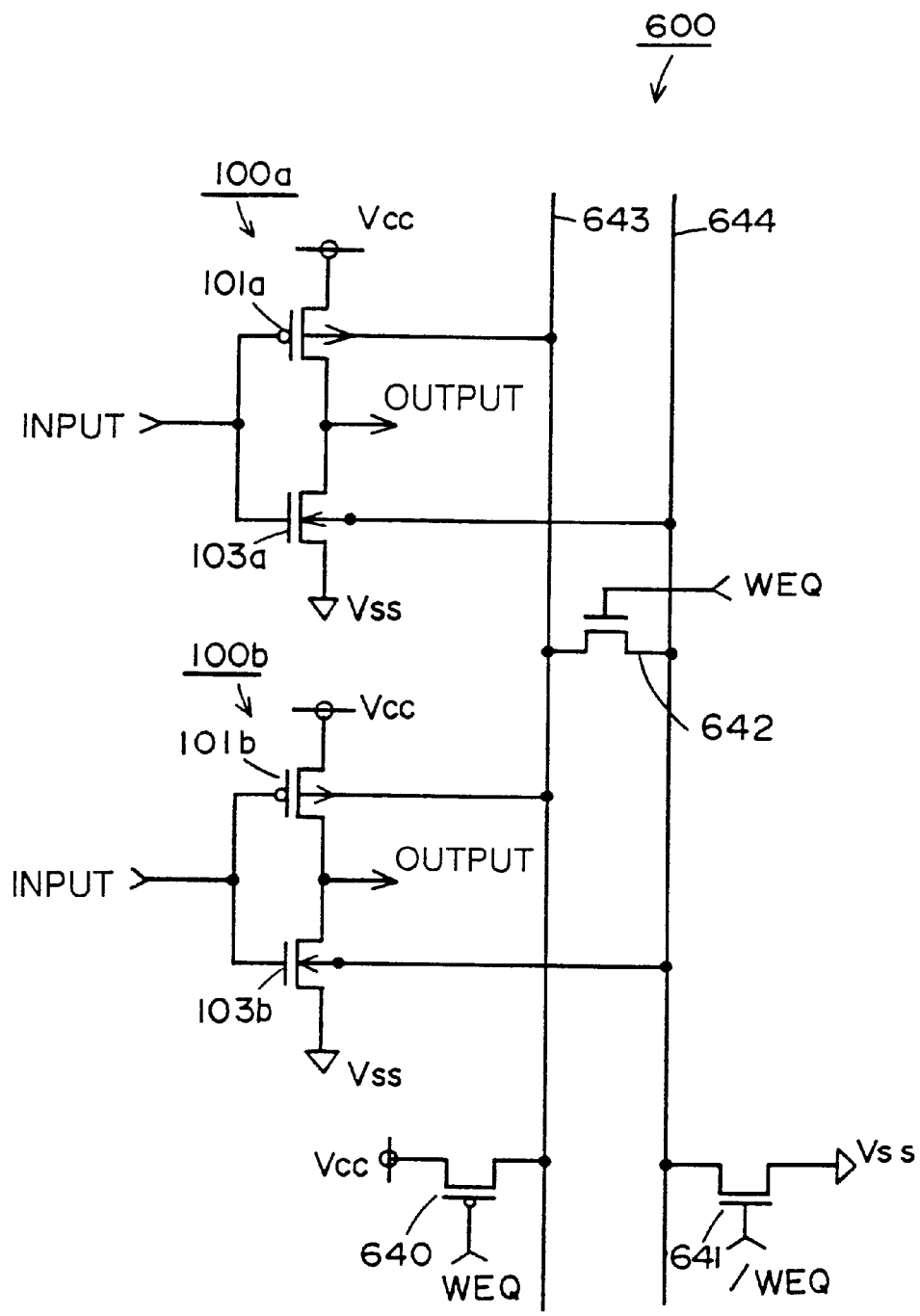
FIG. 6 is a circuit diagram showing an CMOS circuit according to a fourth embodiment of a semiconductor device of the present invention.

FIG. 6 shows an PMOS circuit 600 according to a fourth embodiment of a semiconductor device of the present invention.

Referring to FIG. 6, CMOS circuit 600 includes inverter circuits 100a and 100b, NMOS 641 and 642, a CMOS 640, an N well line 643, and a P well line 644.

Inverter circuit 100a and 100b are similar to inverter circuit 100 of FIG. 1.

The substrate of PMOS 101a in inverter circuit 100a and the substrate of PMOS 101b in inverter circuit 100b are connected by N well line 643. The substrate of NMOS 103a in inverter circuit 100a and the substrate of NMOS 103b in inverter circuit 100b are connected by P well line 644. NMOS 642 has its source electrode connected to N well line 643, its drain electrode connected to P well line 644 and its gate electrode connected to an input node to which a control signal WEQ is applied. PMOS 640 has its source electrode connected to Vcc power supply, its drain electrode connected to N well line 643, and its gate electrode connected to an input node to which control signal WEQ is applied. NMOS 641 has its source electrode connected to ground potential Vss, drain electrode connected to P well line 644, and its gate electrode connected to an input node to which a signal/WEQ which is an inverted version of control signal WEQ is applied.

When PMOS 101a, 101b and NMOS 103a and 103b of FIG. 4 have a structure as shown in FIG. 2, N well line 643 is a conductive wiring or a diffusion layer having hole p injected for electrically connecting respective N well 205 of PMOS 101a and PMOS 101b to each other.

Control signal WEQ of an H level in an active state and an L level in a standby state is applied to the gates of NMOS 642 and PMOS 640. Inverted signal/WEQ is applied to the gate of NMOS 641.

Figure 7:
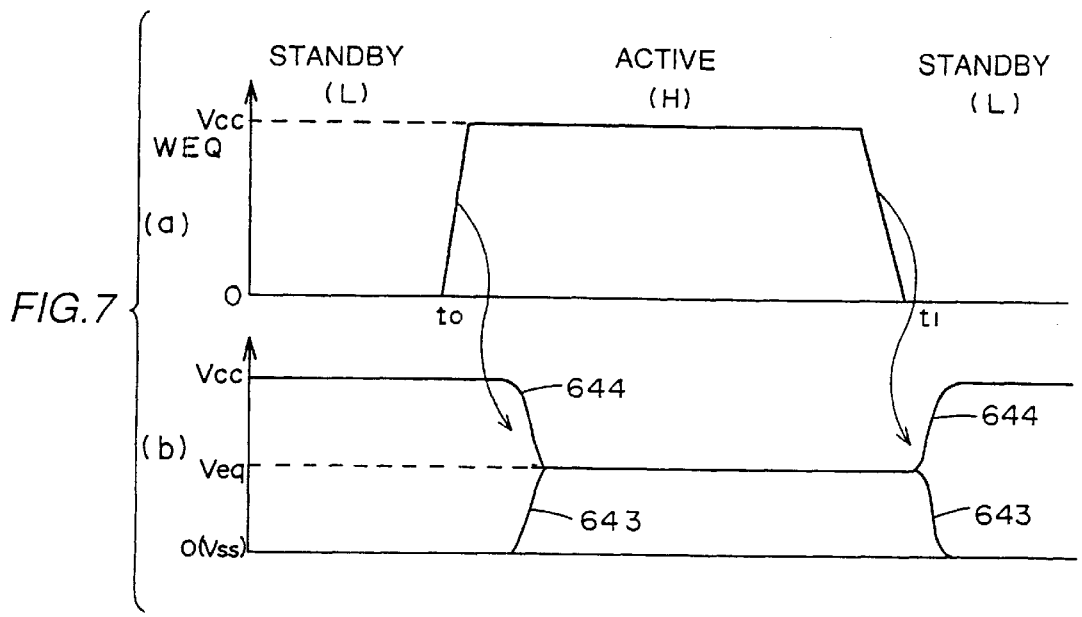
FIG. 7 is a timing chart for describing an operation of the CMOS circuit of FIG. 6.

FIG. 7 is a timing chart for describing an operation of CMOS circuit 600 of FIG. 6, wherein (a) shows change in control signal WEQ and (b) shows change in the potential of N well line 643 and P well line 644.

Referring to FIG. 7, only time $t_0$ to time $t_1$ is an active state. During the standby state before time $t_0$, control signal WEQ attains an L level. Here, PMOS 640 and NMOS 641 are turned on, whereby the potentials of N well line 643 and P well line 644 are driven to the level of Vcc and Vss, respectively. When control signal WEQ is pulled up to an H level at time $t_0$ to enter an active state, PMOS 640 and NMOS 641 are turned off and NMOS 642 is turned on. Therefore, the potentials of N well line 643 and P well line 644 are driven to the same potential level of Veq via NMOS 642 as shown in FIG. 7 (b). In a standby state, back bias Vbs (PMOS) of PMOS 101a and 101b becomes Vbs (PMOS)= veq−Vcc. Back bias Vbs (NMOS) of NMOS 103a and 103b become Vbs (NMOS)=Veq−Vss. Therefore, the threshold voltages of PMOS 101a and 101b and NMOS 103a and 103b are lower in an active state than in a standby state due to the back bias effect. Leakage current can be suppressed in a standby state while realizing high speed operation in an active state.

The amount of charge that is charged/discharged when Vbs is varied is C1 (Vcc−Veq). The load when N well 205 is charged from the level of Veq to Vcc can be used in driving P well 206 to the level of Veq from the level of Vss. In contrast to the first embodiment where the potentials of level Veq1 and Veq2 must be generated by another power supply circuit, the potential of Veq level of the fourth embodiment is generated by equalization due to connection between N well line 643 and P well line 644. Therefore, a power supply circuit for generating a potential of Veq level is not necessary. This means that there is no current that will be consumed by this power supply circuit. Therefore, consumption power can further be reduced than in the first embodiment.

As already described in the first embodiment, a forward bias is applied to the p-n junction of respective source electrodes of PMOS 101a and 101b and NMOS 103a and 103b in an active state in the second to fourth embodiments. At a low voltage where Vcc=1 V, Veq=0.5 V, the forward bias (Vcc−Veq) of the p-n junction of the above mentioned PMOS and the forward bias Veq of the p-n junction of the aforementioned NMOS both attain the level of 0.5 V, which is lower than the built-in potential Φbuild of 0.7–0.8 at the p-n junction. Therefore, the forward bias voltage of the p-n junction is so low that it can be neglected.

Although a plurality of inverter circuits formed of PMOS 100a and 100b and NMOS 103a and 103 was shown in FIG. 6, the present invention can be applied to an CMOS circuit of NAND or NOR gates and the like. Furthermore, the present invention is not limited to the embodiment where N well 205 and P well 206 are formed independent per one MOS transistor, and can be applied to the case where a plurality of NMOS transistors are formed on the same N well 205 and P well 206. CMOS circuit 600 of the fourth embodiment may be formed on not only a bulk semiconductor substrate as shown in FIGS. 2A, 2B and 4, but also an SOI substrate as shown in FIG. 5.

(5) Fifth Embodiment

In the fourth embodiment, a potential of Veq level which is the potential of the substrates of PMOS and NMOS in an active state is generated by equalization. The Veq level is offset from the level of Vcc/2 when the parasitic capacitance of each N well and P well connected to respective N well line 643 and P well line 644 of FIG. 6 differ. For example, assuming that the parasitic capacitance C1 of N well 205 connected to N well line 643 is two times the parasitic capacitance C2 of P well 206 connected to P well line 644, the Veq level becomes Vcc/3. Here, the reverse bias across the source and substrate of the PMOS in an active state is Vbs (PMOS)=Vcc/3−Vcc=−2 Vcc/3, and the reverse bias across the source and substrate of the NMOS is Vbs (NMOS)=Vcc/3−Vss=Vcc/3. Therefore, imbalance occurs between back bias Vbs (CMOS) and Vbs (NMOS) of the PMOS and NMOS. In this case, the PMOS has a greater variation in the threshold voltage in a standby state and an active state than the NMOS.

The equalize level Veq must be set to Vcc/2 in order to equal the variation of back bias Vbs (PMOS) and that of back bias Vbs (NMOS).

Figure 8:
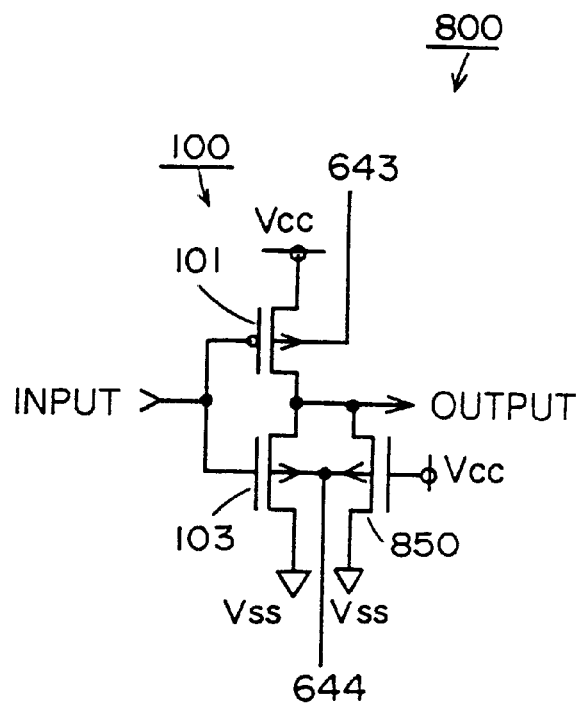
FIGS. 8–11 are circuit diagrams showing an CMOS circuit according to fifth to eighth embodiments, respectively, of a semiconductor device of the present invention.

FIG. 8 shows an CMOS circuit 800 according to a fifth embodiment of a semiconductor device of the present invention.

CMOS circuit 800 of FIG. 8 can be interchanged with inverter circuits 100a or 100b of CMOS circuit 600 shown in FIG. 6. CMOS circuit 800 includes an inverter circuit 100 similar to that of FIG. 1, and a dummy NMOS 850.

The connection within inverter circuit 100 of FIG. 8 is as described with reference to FIG. 1. Dummy NMOS 850 has its source connected to ground potential Vss, its drain electrode connected to an output node of inverter circuit 100, its gate electrode connected to Vcc power supply, and the substrate connected to P well line 644. The substrate of PMOS 801 in inverter circuit 100 is connected to N well line 643. The substrate of NMOS 103 is connected to P well line 644.

When parasitic capacitance C1 of N well 205 of PMOS 101 is greater than parasitic capacitance C2 of P well 206 in NMOS 103, the parasitic capacitance of N well line 643 connected to N well 205 can be made equal to that of P well line 644 connected to P well 206 by dummy NMOS 850 of FIG. 8 having its source electrode connected to an output node of inverter 100, its drain electrode connected to ground potential Vss, its gate electrode connected to Vss power supply, and the substrate connected to P well line 644. When parasitic capacitance C1 of N well 205 is smaller than parasitic capacitance C2 of P well 206, the parasitic capacitance of N well line 643 can be made equal to that of P well line 644 by a dummy PMOS having its source electrode connected to Vcc power supply, its drain electrode connected to an output node of inverter circuit 100, its gate electrode connected to ground potential Vss, and the substrate connected to N well line 643.

CMOS circuit 800 of the fifth embodiment may be formed on not only a bulk semiconductor substrate as shown in FIGS. 2A, 2B an 4, but also an SOI substrate as shown in FIG. 5.

(6) Sixth Embodiment

Figure 9:
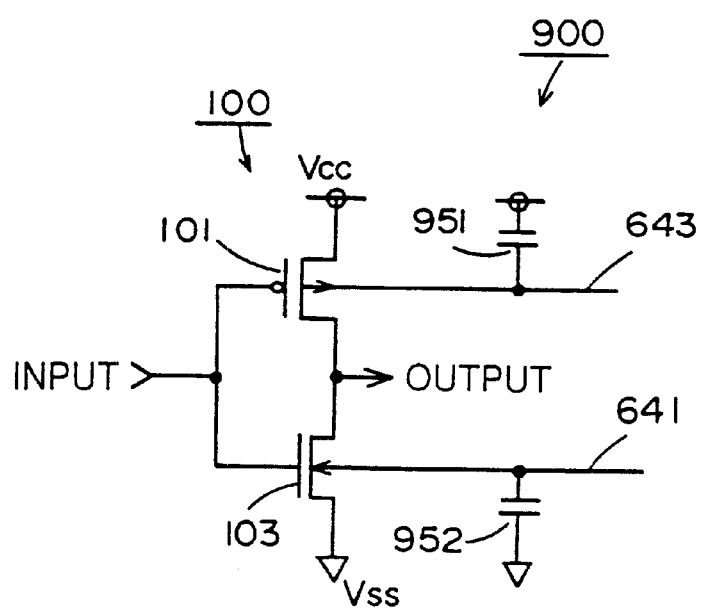

FIG. 9 is a diagram showing a CMOS circuit 900 according to a sixth embodiment of a semiconductor device of the present invention.

CMOS circuit 900 of FIG. 9 is interchangeable with inverter circuit 100a or 100b of CMOS circuit 600 in FIG. 6. CMOS circuit 900 includes an inverter circuit 100 similar to that of FIG. 1, and capacitances 951 and 952.

The connection within inverter circuit 100 is as shown in FIG. 1. The substrate of PMOS 101 is connected to N well line 643. The substrate of NMOS 103 is connected to P well line 644. Capacitance 951 has one electrode connected to Vcc power supply, and the other electrode connected to N well line 643. Capacitance 952 has one electrode connected to ground potential Vss and the other electrode connected to P well 644.

By connecting capacitances 951 and 952 formed of an MOS transistor and wiring as shown in FIG. 9, the parasitic capacitance of N well line 643 can be made equal to that of P well line 644.

The capacitance may be connected to only either of N well line 643 or P well line 644, although the adjustment of the parasitic capacitance is facilitated when connected to both lines as shown in FIG. 9.

The parasitic capacitance of N well line 643 can be made equal to that of P well line 644 by supplying independently a potential of Veq level from Vcc/2 power supply as an alternative of connecting a dummy MOS transistor and capacitance as shown in FIGS. 8 and 9. Furthermore, the parasitic capacitance can be made equal by a combination thereof.

CMOS circuit 900 of the sixth embodiment may be formed on not only a bulk semiconductor substrate as shown in FIGS. 2A, 2B and 4, but also an SOI substrate as shown in FIG. 5.

(7) Seventh Embodiment

Figure 10:
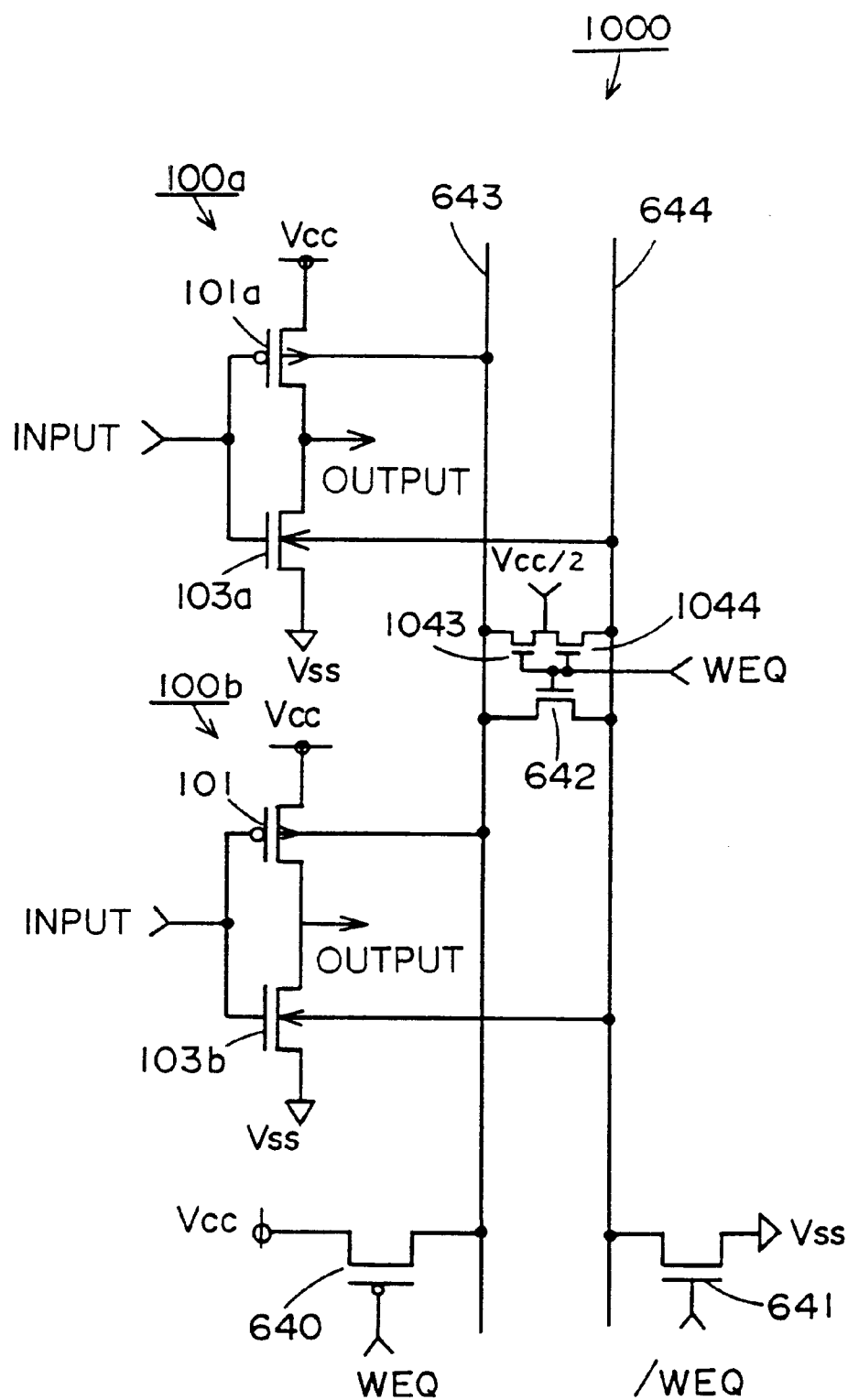

FIG. 10 shows another CMOS circuit 1000 differing from that shown in FIGS. 8 and 9.

Referring to FIG. 10, CMOS circuit 1000 includes a CMOS circuit 600 similar to that shown in FIG. 6, an NMOS 1043, and an NMOS 1044.

NMOS 1043 and 1044 have their source electrodes connected to each other and their gate electrodes connected to each other. The connected source electrodes are also connected to Vcc/2 power supply. The connected gate electrodes are also connected to the gate electrode of NMOS 642 in CMOS circuit 600 and to the input node of control circuit WEQ. The drain electrode of NMOS 1043 is connected to N well line 643 in CMOS circuit 600. The drain electrode of NMOS 1044 is connected to P well line 644 in CMOS circuit 600.

NMOS 642, 1043, and 1044 are turned on when control signal WEQ of an H level is applied to respective gate electrodes thereof in an active state. As a result, a potential of Vcc/2 level is supplied from Vcc/2 power supply connected to the source electrodes of NMOS 1043 and 1044 to N well line 643 and P well line 644. Even when the parasitic capacitance of N well line 643 differs from that of P well line 644, the offset of equalize level Veq from Vcc/2 is compensated for by the Vcc/2 power supply to result in equalize level Veq=Vcc/2.

Thus, the operating speed of the NMOS and the PMOS is substantially equalized in the CMOS circuit to allow operation at stable speed in addition to the advantages of the first and second embodiments.

CMOS circuit 1000 of the seventh embodiment may be formed on not only a bulk semiconductor substrate as shown in FIGS. 2A, 2B and 4, but also an SOI substrate as shown in FIG. 5.

(8) Eighth Embodiment

Figure 11:
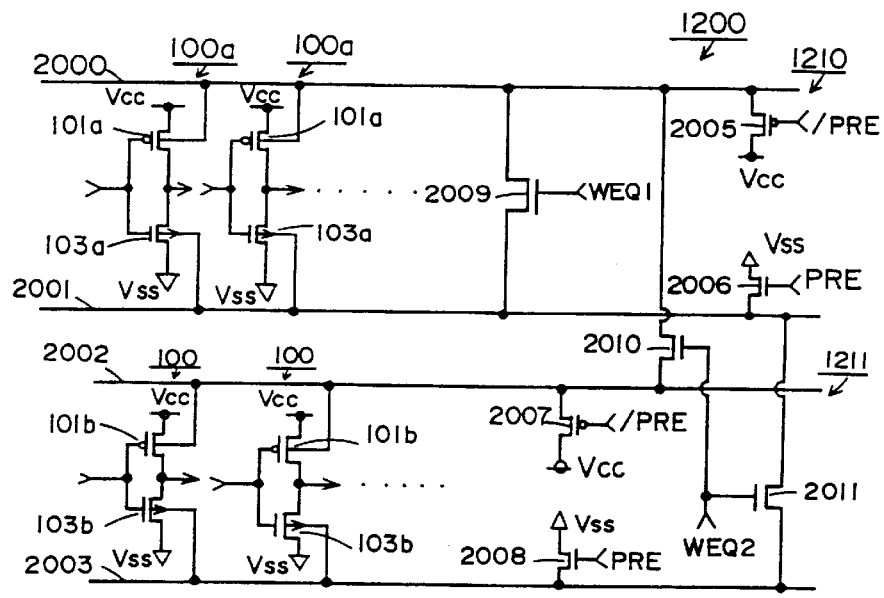

FIG. 11 shows an CMOS circuit 1200 according to an eighth embodiment of a semiconductor of the present invention.

Referring to FIG. 11, CMOS circuit 1200 includes circuits 1210 and 1211, PMOS 2005 and 2007, NMOS 2006, 2008, 2009, 2010 and 2011. Circuit 1210 includes a plurality of inverter circuits 100a, an N well line 2000 for connecting the N wells of the PMOS, and a P well line 2001 for connecting the P wells of NMOS 103a in inverter circuit 100a. Circuit 1211 includes a plurality of inverter circuits 100b, an N well line 2002 connecting the N wells of PMOS 101b, and a P well line 2003 connecting the P wells of NMOS 103b in inverter circuit 100b. Here, inverters 100a and 100b are similar to the inverter shown in FIG. 6.

PMOS 2005 has its source electrode connected to power supply potential Vcc, and its drain electrode connected to N well line 2000. NMOS 2006 has its source electrode supplied with ground potential Vss, and its drain electrode connected to P well line 2001. PMOS 2007 has its source electrode supplied with power supply potential Vcc, and its gate electrode connected to N well line 2002. NMOS 2008 has its source electrode supplied with a potential of Vss level, and its drain electrode connected to P well line 2003. A precharge signal PRE is applied to the gate electrodes of NMOS 2006 and 2008. A signal/PRE which is an inverted version of precharge signal PRE is applied to the gate electrodes of PMOS 2005 and 2007.

NMOS 2009 has its source electrode connected to P well line 2001 and its drain electrode connected to N well line 2000. NMOS 2010 has its one of the source-drain electrodes connected to N well line 2000 and the other connected to N well line 2002. NMOS 2011 has one of the source/drain electrodes connected to P well line 2001 and the other connected to P well line 2003. An equalize signal WEQ1 is applied to the gate electrode of NMOS 2009. An equalize signal WEQ2 is applied to both of the gate electrodes of NMOS 2010 and 2011.

Figure 12:
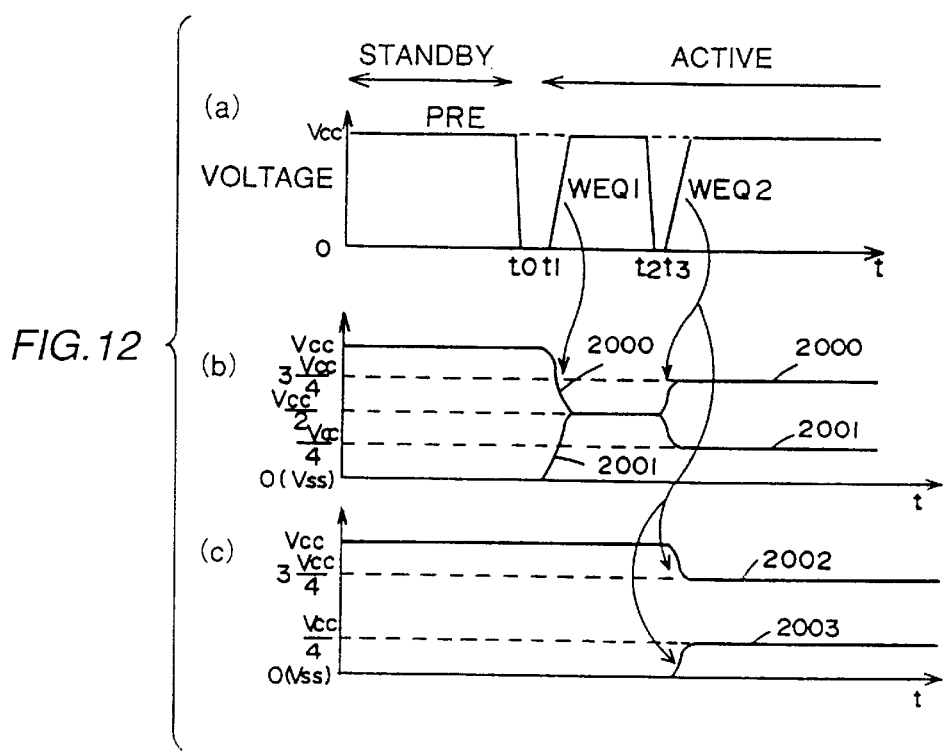
FIG. 12 is a timing chart for describing an operation of the CMOS circuit of FIG. 11.

FIG. 12 is a timing chart for describing an operation of CMOS circuit 1200 of FIG. 11, wherein (a) shows inputs of precharge signal PRE and equalize control signals WEQ1 and WEQ2 in a standby state and an active state, (b) shows change in potential of N well line 2000 and P well line 2001 of circuit 1210, and (c) shows change in potential of N well line 2002 and P well line 2003 of circuit 1211.

An operation of CMOS circuit 1200 of FIG. 11 will be described hereinafter with reference to FIG. 12.

In a standby state where circuits 1210 and 1211 do not operate, equalize signals WEQ1 and WEQ2 both attain an L level. Precharge signal PRE attains an H level, and PMOS 2005, 2007 and NMOS 2006, 2008 are turned on, whereby N well lines 2000 and 2002 are set to be level of power supply potential Vcc and P well lines 2001 and 2003 are precharged to the level of ground potential Vss.

Entering an active state, precharge signal PRE is pulled down to an L level at time $t_0$, whereby PMOS 2005, 2007 and NMOS 2006, 2008 precharging respective N and P well lines are turned off. At time $t_1$, equalize signal WEQ1 is pulled up to an H level, whereby P well line 2000 and N well line 2001 of circuit 1210 are equalized to result in a potential of ½ Vcc. At time $t_2$, equalize signal WEQ1 is pulled down to an L level, whereby NMOS 2009 is turned off. At time $t_3$, equalize signal WEQ2 is pulled up to an H level, whereby NMOS 2010 and 2011 are turned on. Since P well line 2002 and N well 2003 of circuit 1211 are precharged to the level of power supply potential Vcc and ground potential Vss, respectively, the potentials of P well lines 2000 and 2002 are set to ¾ Vcc by NMOS 2010, and the potentials of N well line 2001 and 2003 are set to the level of ¼ Vcc by NMOS 2011.

Thus, PMOS 101a and NMOS 103a within inverter 100a in circuit 1210 and PMOS 101b and NMOS 103b within inverter 100b in circuit 1211 is set to back bias Vbs=0 V in an a standby state and Vbs (NMOS)=¼ Vcc, Vbs (PMOS)=¾ Vcc–Vcc=–¼ Vcc in an active state. By the back bias effect, the threshold voltages of the NMOS and the PMOS in the circuit is smaller in an active state than in a standby state to allow high speed operation.

In an active state, back bias Vbs (NMOS)=¼ Vcc and back bias Vbs (PMOS)=–¼ Vcc, so that a potential of ¼ Vcc level of a forward bias is applied across the source and well (substrate) of respective NMOS and PMOS. The current at the p-n junction conducted by a forward bias is so small that it can be neglected as long the ¼ Vcc level is below built-in potential Φbuild.

Furthermore, by the relationship of ¼ Vcc≦Φbuild, Vcc≦4 Φbuild is obtained. This means that a power supply voltage Vcc of a level up to four times the builtin potential Φbuild can be applied. Since Vcc≦2 Φbuilt in the fourth embodiment shown in FIG. 6, a power supply voltage Vcc of a higher level can be applied in the present embodiment.

The above description was provided of the case where respective parasitic capacitances of N well lines 2000, 2002, and P well line 2001 and 2003 are equal. When the parasitic capacitance differs in the above N well line and P well line, the capacitance of each well can easily be adjusted by adding a dummy transistor or a capacitive element as shown in FIGS. 8 and 9 of the fifth and sixth embodiments.

The present embodiment can be applied to the SOI of the third embodiment shown in FIG. 5, as well as to the triple well structure of the first and second embodiments shown in FIGS. 2 and 4.

(9) Ninth Embodiment

Figure 13:
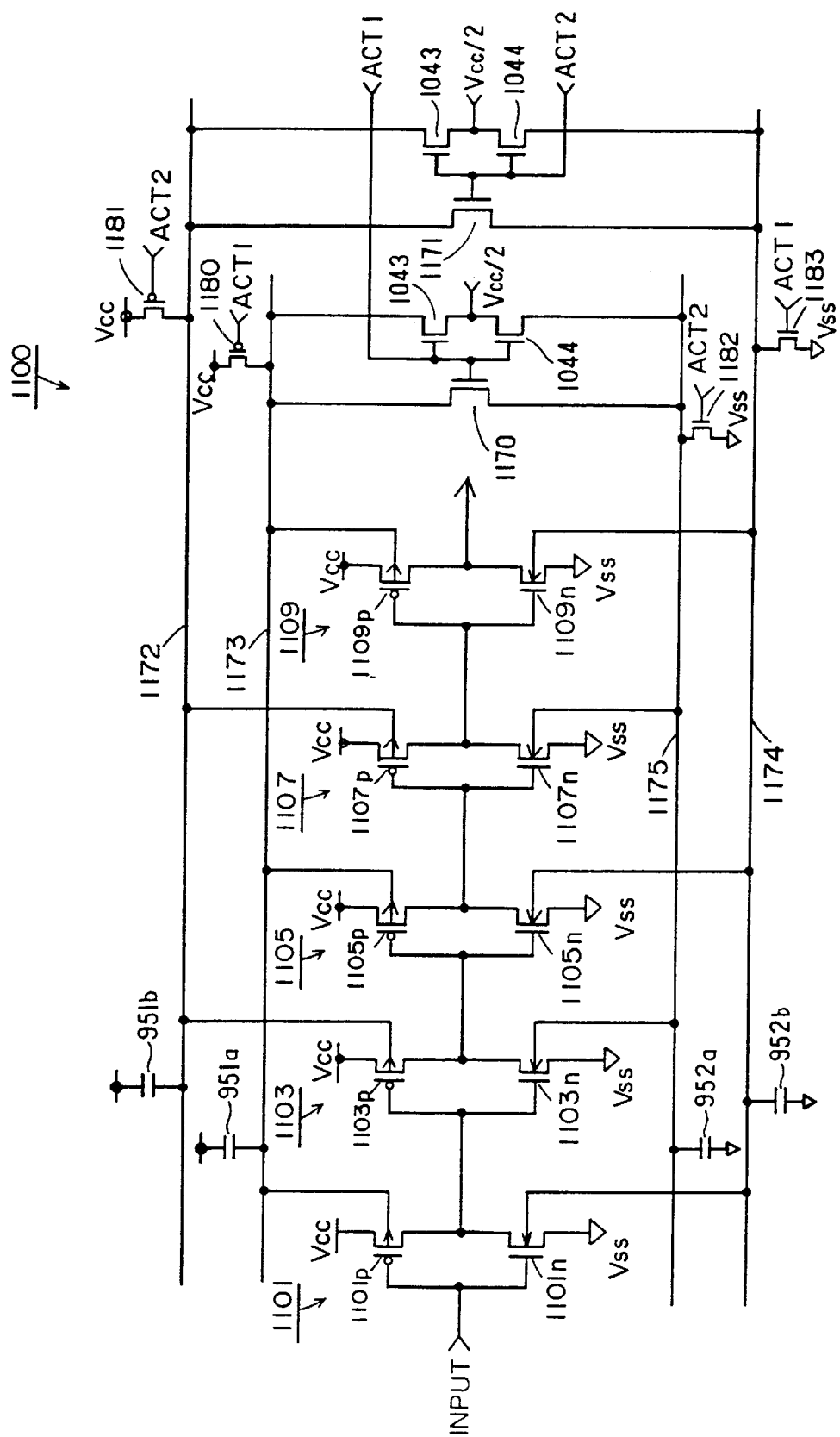
FIG. 13 is a circuit diagram showing an CMOS circuit according to a ninth embodiment of a semiconductor device according to the present invention.

FIG. 13 shows an CMOS circuit 1100 according to a ninth embodiment of a semiconductor device of the present invention.

Referring to FIG. 13, CMOS circuit 1100 includes inverter circuits 1101, 1103, 1105, 1107, 1109, PMOS 1180, 1181, NMOS 1043, 1044, 1170, 1171, 1182, 1183, N well lines 1172, 1173, P well lines 1174, 1175, and capacitances 951a, 951b, 952a, 952b.

Inverter circuit 1101 includes a PMOS 1101p and an NMOS 1101n. Similarly, inverter circuit 903 includes an PMOS 1103p and an NMOS 1103n; inverter circuit 1105 includes a PMOS 1105p and an NMOS 1105n; inverter circuit 1107 includes an PMOS 1107p and an NMOS 1107n; and inverter circuit 1109 includes an PMOS 1109p and an NMOS 1109n.

Inverter circuit 1101 has its output node connected to an input node of inverter circuit 1103. Inverter circuit 1103 has its output node connected to an input node of inverter circuit 1105. Inverter circuit 1105 has its output node connected to an input node of inverter circuit 1107. Inverter circuit 1107 has its output node connected to an input node of inverter circuit 1109.

The connection of inverter circuits 1101, 1103, 1105, 1107, and 1109 is similar to that of the inverter circuit (CMOS circuit 100) shown in FIGS. 1A and 1B.

The substrate of PMOS 1101p of inverter circuit 1101, the substrate of PMOS 1105p of inverter circuit 1105, and the substrate of PMOS 1109p of inverter circuit 1109 are connected to an N well line 1173. The substrate of PMOS 1103p of inverter circuit 1103 and the substrate of PMOS 1107p of substrate circuit 1107 are connected to N well line 1107p. The substrate of NMOS 1101n of inverter circuit 1101, the substrate of NMOS 1105n of inverter circuit 1105, and the substrate of NMOS 1109n of inverter circuit 1109 are connected to a P well line 1174. The substrate of NMOS 1103n of inverter circuit 1103 and the substrate of NMOS 1107n of inverter circuit 1107 are connected to a P well line 1175.

PMOS 1180 has its source electrode connected to Vcc power supply, its drain electrode connected to N well line 1173, and its gate electrode connected to an input node of an equalize control signal ACT1. PMOS 1181 has its source electrode connected to Vcc power supply, its drain electrode connected to N well line 1172, and its gate electrode connected to an input node of an equalize control signal ACT2. NMOS 1182 has its source electrode connected to ground potential Vss, its drain electrode connected to P well line 1175, and its gate electrode connected to an input node of equalize control signal ACT2. NMOS 1183 has its source electrode connected to ground potential Vss, its drain electrode connected to P well line 1174, and its gate electrode connected to an input node of equalize control signal ACT1. NMOS 1170 has its source electrode connected to P well line 1175, its drain electrode connected to N well line 1173, and its gate electrode connected to an input node of equalize control signal ACT1. NMOS 1171 has its source electrode connected to P well line 1174, its drain electrode connected to N well line 1172 and its gate electrode connected to an input node of equalize control signal ACT2.

When NMOS 1101n, 1103n, 1105n, 1107n, 1109n and PMOS 1101p, 1103p, 1105p, 1107p, and 1109p are formed in the triple well structure shown in FIGS. 2 and 4, N well lines 1172 and 1173 are a conductive layer connecting N well 205 in each of PMOS, and P well lines 1174 and 1175 are a conductive layer connecting P well 206 in each NMOS.

When formed according to the SOI structure shown in FIG. 5, N well lines 1172 and 1173 are a conductive layer connecting N active region 505, and N well lines 1174 and 1175 are a conductive layer connecting P type active region 506.

Figure 14:
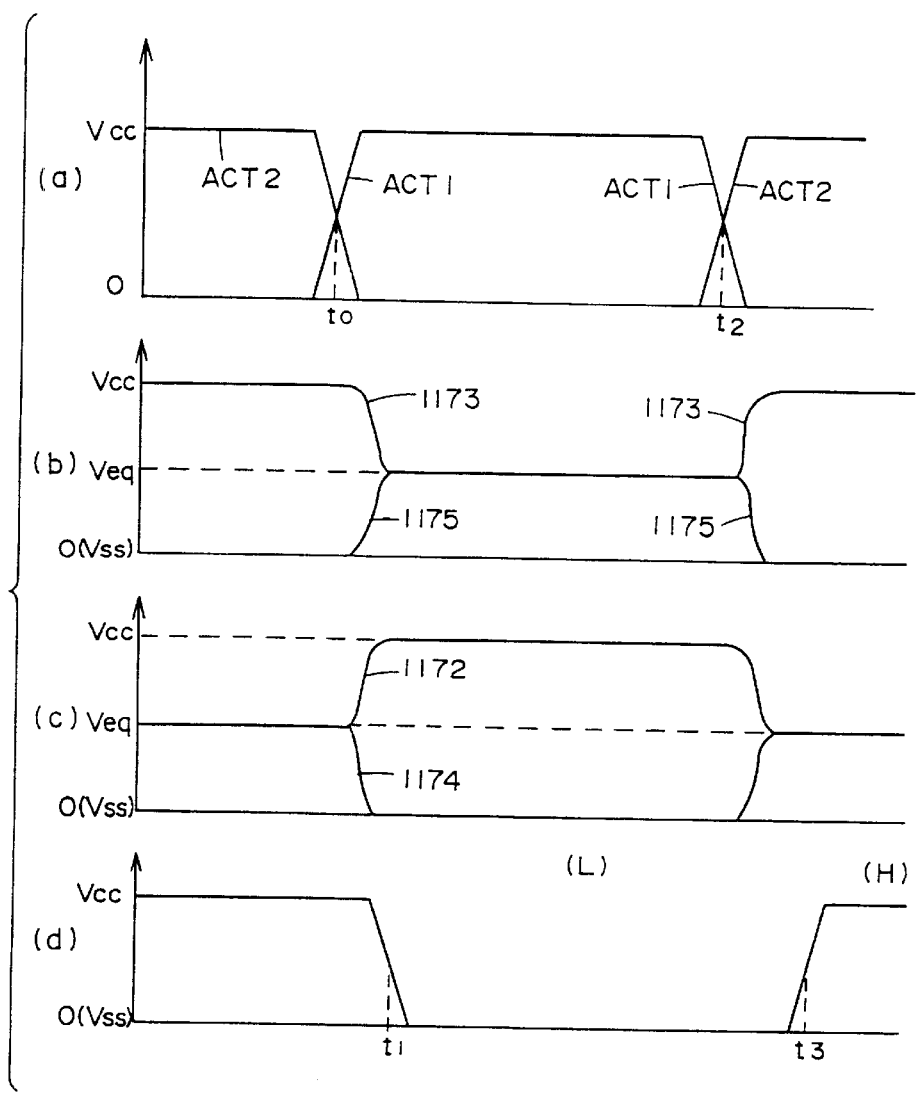
FIG. 14 is a timing chart for describing an operation of the CMOS circuit of FIG. 11.
Figure 15:
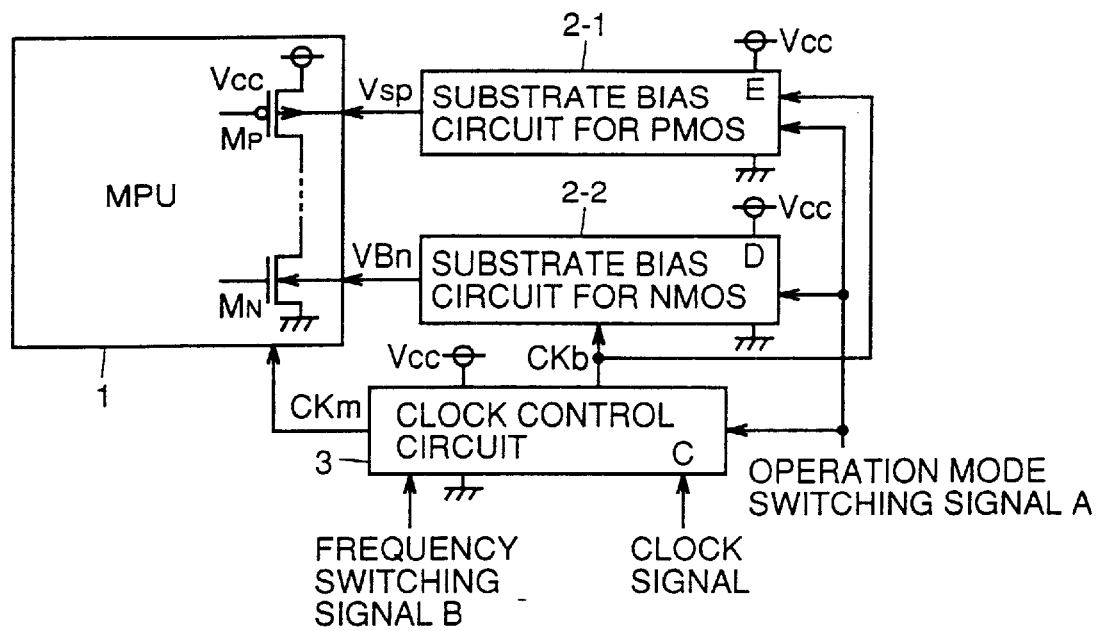
FIG. 15 is a block diagram showing a conventional low consumption power type integrated semiconductor device disclosed in Japanese Patent Laying-Open No. 5-1081941.

FIG. 14 is a timing chart for describing an operation of CMOS circuit 1100 of FIG. 11, wherein (a) shows the modes of equalize control signals ACT1 and ACT2, (b) shows change in the potentials of N well line 1173 and P well line 1175, (c) shows change in the potentials of N well line 1172 and P well line 1174, and (d) shows the mode of an input signal towards inverter 1.

The operation of CMOS circuit 1100 of FIG. 13 will be described hereinafter with reference to the timing chart of FIG. 14.

First, a case where an input signal of an H level is applied to inverter circuit 1101 in a standby state will be described.

NMOS 1171 is turned on, and N well line 1172 and P well line 1174 attain the equalize level of Veq. Also, NMOS 1170 is turned off and NMOS 1171 is turned on, so that N well line 1171 attains the level of Vcc and P well line 1175 attains the level of Vss (=0 V). Therefore, in response to an input signal of an H level in inverter circuit 1101, N well 205 of PMOS 1103p and 1107p and P well 206 of NMOS 1101n, 1105n and 1109n attaining an ON state are set to the level of Veq, N well 205 of PMOS 1101p, 1105p, 1109p attaining an OFF state is set to the level of Vcc, and P well 206 of NMOS 1103n and 1107n attaining an OFF state is set to the level of Vss. As a result, the threshold voltage of an NMOS transistor turned off becomes greater than that of an MOS transistor turned on. Therefore, leakage current between Vcc-Vss through an NMOS transistor turned off can be suppressed.

The above describes the operation before time $t_0$ where equalize control signal ACT1 attains an L level and equalize control signal ACT2 attains an H level. For the purpose of realizing high speed output at the transition of the input into inverter circuit 1101 from H to L at time $t_1$, equalize signal ACT1 is pulled up to an H level from an L level and equalize control signal ACT2 is pulled down to an L level from an H level at time $t_0$ before time $t_1$. Here, NMOS 1170 is turned on, whereby N well line 1173 and P well line 1175 are equalized to be driven to the level of Veq. Also, NMOS 1171 is turned off, whereby N well line 1172 and P well line 1174 both attain the level of Vss (=0 V) from the Veq level and the Veq level, respectively. Therefore, the threshold voltage of the MOS transistor having its well connected to P well line 1173 or P well line 1175 is reduced, whereas the threshold voltage of the NMOS transistor having its well connected to N well line 1172 or P well line 1174 is increased. At the transition from an H level to an L level towards inverter circuit 1101 at time $t_1$, the NMOS transistor is rapidly turned on to realize high speed output since the threshold voltage of the NMOS transistor exhibiting a transition from OFF to ON is lowered. In contrast, the threshold voltage of the NMOS transistor exhibiting a transition from ON to OFF is increased, so that the leakage current after an output is ascertained can be suppressed.

Similarly, the above-described advantage can be achieved when the input into inverter circuit 1101 shows a transition from an L level to an H level at time $t_3$. By pulling down equalize control signal ACT1 to an L level and pulling up equalize control signal ACT2 to an H level at time $t_2$ prior to the transition, NMOS 1170 is turned off to drive N well line 1173 and P well line 1175 to Vcc level and Vss level, respectively, and N well line 1172 and P well 1174 turned on by NMOS 1171 are equalized to be driven to Veq level. Furthermore, the threshold voltages of the NMOS transistor can be varied taking advantage of potentials Vcc and Vss applied to N well lines 1172, 1173 and P well lines 1174, 1175 to allow reduction in consumption power.

When the level of the parasitic capacitance of each well connected to N well lines 1172, 1173 and P well lines 1174, 1175 differs in CMOS circuit 1100 in FIG. 13, the parasitic capacitance thereof can be adjusted using a dummy transistor or capacitances 951a, 951b, 952a and 952b as in the fifth and sixth embodiments. Alternatively, NMOS 1043 and 1044 can be provided as in the subsequent embodiment to supply individually a potential of Veq level from Vcc/2 power supply. Variation in the threshold voltage can be adjusted to be substantially equal by setting equalize level Veq=Vcc/2 and to equalize the variation of each back bias Vbs for the PMOS and the NMOS.

As a result, the operation speed of PMOS is substantially equal to that of NMOS to allow operation at stable speed as the overall circuit.

The number of inverter circuits in FIG. 13 is only a way of example, it is not limited to 5. CMOS circuit 1100 of the ninth embodiment may be formed on not only a bulk semiconductor substrate as shown in FIGS. 2A, 2B and 4, but also an SOI substrate as shown in FIG. 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a first CMOS circuit including first P and N channel MOS transistors a second CMOS circuit including second P and N channel MOS transistors and having an input coupled to an output of said first CMOS circuit, a third CMOS circuit including third P and N channel MOS transistors and having an input coupled to an output of said second CMOS circuit, a first line coupled to a substrate of each of said first and third P channel MOS transistors, commonly, a second line coupled to a substrate of each of said first and third N channel MOS transistors, commonly, first potential supply means for supplying to said first line a first potential equal to or higher than a potential of a source electrode of each of said first and third P channel MOS transistors when said first and third P channel MOS transistors are turned off, second potential supply means for supplying to said first line a second potential lower than the potential of the source electrode of each of said first and third P channel MOS transistors when said first and third P channel MOS transistors are turned on, third potential supply means for supplying to said second line a third potential equal to or lower than a potential of a source electrode of each of said first and third N channel MOS transistors when said first and third N channel MOS transistors are turned off, and fourth potential supply means for supplying to said second line a fourth potential higher than the potential of the source electrode of each of said first and third N channel MOS transistors when said first and third N channel MOS transistors are turned on.

2. The semiconductor device according to claim 1, further comprising an SOI substrate on which said P and N channel MOS transistors are formed.

3. A semiconductor device having a standby state and an active state, comprising:

a first N channel MOS transistor;

a first P channel MOS transistor;

a second N channel MOS transistor;

a second P channel MOS transistor;

precharge means for precharging back gates of said first and second N channel MOS transistors to a level of a ground potential and back gates of said first and second P channel MOS transistors to a level of a power supply potential in said standby state;

first short circuit means for short-circuiting the back gates of said first and second N channel MOS transistors and the back gates of said first and second P channel MOS transistors in said active state;

second short circuit means for short-circuiting the back gate of said first N channel MOS transistor and the back gate of said first P channel MOS transistor after precharging by said precharge means and before short-circuiting by said first short circuit means; and an SOI substrate on which said first P and N channel MOS transistors and said second P and N channel MOS transistors are formed.

4. A semiconductor device comprising:

a first CMOS circuit including first P and N channel MOS transistors, a second CMOS circuit including second P and N channel MOS transistors and having an input coupled to an output of said first CMOS circuit, first potential supply means for supplying to a substrate of said first P channel MOS transistor a first potential equal to or higher than a potential of a source electrode of said first P channel MOS transistor when said first P channel MOS transistor is turned off, second potential supply means for supplying to a substrate of said second P channel MOS transistor a second potential equal to or higher than a potential of a source electrode of said second P channel MOS transistor when said second P channel MOS transistor is turned off, third potential supply means for supplying to a substrate of said first N channel MOS transistor a third potential equal to or lower than a potential of a source electrode of said first N channel MOS transistor when said first N channel MOS transistor is turned off, fourth potential supply means for supplying to a substrate of said second N channel MOS transistor a fourth potential equal to or lower than a potential of a source electrode of said second N channel MOS transistor when said second N channel MOS transistor is turned off, fifth potential supply means for supplying to the substrate of each of said first P and second N channel MOS transistors a fifth potential lower than the potential of the source electrode of said first P channel MOS transistor and higher than the potential of the source electrode of said second N channel MOS transistors when said first P and second N channel MOS transistors are turned on, and sixth potential supply means for supplying to the substrate of each of said first N and second P channel MOS transistors a sixth potential higher than the potential of the source electrode of said first N channel MOS transistor and lower than the potential of the source electrode of said second P channel MOS transistor when said first N and second P channel MOS transistors are turned on.

* * * * *